(12) United States Patent
Chen et al.

(10) Patent No.: US 9,478,735 B1
(45) Date of Patent: Oct. 25, 2016

(54) MAGNETIC TUNNEL JUNCTIONS

(71) Applicant: Micron Technology, Inc., Boise, ID (US)

(72) Inventors: Wei Chen, White Plains, NY (US);
Witold Kula, Gilroy, CA (US);
Jonathan D. Harms, Boise, ID (US);
Sunil S. Murthy, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/746,421

(22) Filed: Jun. 22, 2015

(51) Int. Cl.
| | | |
|---|---|---|
| H01L 29/82 | (2006.01) | |
| H01L 43/00 | (2006.01) | |
| H01L 43/10 | (2006.01) | |
| H01L 43/02 | (2006.01) | |

(52) U.S. Cl.
CPC .............. *H01L 43/10* (2013.01); *H01L 43/02* (2013.01)

(58) Field of Classification Search
CPC ....... H01L 43/08; H01L 43/10; H01L 43/02; H01L 27/222
USPC ........... 257/421, E29.323, E43.004, E21.665
See application file for complete search history.

(56) References Cited

U.S. PATENT DOCUMENTS

| | | | | |
|---|---|---|---|---|
| 2010/0096716 | A1* | 4/2010 | Ranjan et al. ......... | B82Y 10/00 257/421 |
| 2011/0062537 | A1* | 3/2011 | Oh et al. ................ | B82Y 25/00 257/421 |
| 2013/0224521 | A1* | 8/2013 | Wang et al. ............ | G11B 5/66 428/828 |

OTHER PUBLICATIONS

U.S. Patent Application No. 14/563,303, filed Dec. 8, 2014 by Chen et al.

* cited by examiner

*Primary Examiner* — Thien F Tran
(74) *Attorney, Agent, or Firm* — Wells St. John P.S.

(57) ABSTRACT

Some embodiments include a magnetic tunnel junction which has a conductive first magnetic electrode containing magnetic recording material, a conductive second magnetic electrode spaced from the first electrode and containing magnetic reference material, and a non-magnetic insulator material between the first and second electrodes. The magnetic recording material of the first electrode includes a set having an iridium-containing region between a pair of non-iridium-containing regions. In some embodiments, the non-iridium-containing regions are cobalt-containing regions.

10 Claims, 3 Drawing Sheets

MAGNETIC TUNNEL JUNCTIONS

TECHNICAL FIELD

Magnetic tunnel junctions.

BACKGROUND

A magnetic tunnel junction is an integrated circuit component having two conductive magnetic electrodes separated by a thin non-magnetic tunnel insulator material (e.g., dielectric material). The insulator material is sufficiently thin such that electrons can tunnel from one magnetic electrode to the other through the insulator material under appropriate conditions. At least one of the magnetic electrodes can have its overall magnetization direction switched between two states at a normal operating write or erase current/voltage, and is commonly referred to as the "free" or "recording" electrode. The other magnetic electrode is commonly referred to as the "reference", "fixed", or "pinned" electrode, and whose overall magnetization direction will not switch upon application of the normal operating write or erase current/voltage. The reference electrode and the recording electrode are electrically coupled to respective conductive nodes. Electrical resistance between those two nodes through the reference electrode, insulator material, and the recording electrode is dependent upon the magnetization direction of the recording electrode relative to that of the reference electrode. Accordingly, a magnetic tunnel junction can be programmed into one of at least two states, and those states can be sensed by measuring current flow through the magnetic tunnel junction. Since magnetic tunnel junctions can be "programmed" between two current-conducting states, they have been proposed for use in memory integrated circuitry. Additionally, magnetic tunnel junctions may be used in logic, sensors, oscillators or other circuitry apart from or in addition to memory.

The overall magnetization direction of the recording electrode can be switched by a current-induced external magnetic field or by using a spin-polarized current to result in a spin-transfer torque (STT) effect. Charge carriers (such as electrons) have a property known as "spin" which is a small quantity of angular momentum intrinsic to the carrier. An electric current is generally unpolarized (having about 50% "spin-up" and about 50% "spin-down" electrons). A spin-polarized current is one with significantly more electrons of either spin. By passing a current through certain magnetic material (sometimes also referred to as polarizer material), one can produce a spin-polarized current. If a spin-polarized current is directed into a magnetic material, spin angular momentum can be transferred to that material, thereby affecting its magnetization orientation. This can be used to excite oscillations or even flip (i.e., switch) the orientation/domain direction of the magnetic material if the spin-polarized current is of sufficient magnitude.

An alloy or other mixture of Co and Fe is one common material proposed for use as a polarizer material and/or as at least part of the magnetic recording material of a recording electrode in a magnetic tunnel junction. A more specific example is $Co_xFe_yB_z$ where x and y are each 10-80 and z is 0-50, and may be abbreviated as CoFe or CoFeB. MgO may be a suitable material for the non-magnetic tunnel insulator.

Tunnel insulator materials are often crystalline, and are desired to have a body-centered-cubic bcc (001) lattice.

Tunnel insulator and polarizer materials may be deposited using any suitable methodology (e.g., physical vapor deposition). One technique usable to ultimately produce the bcc (001) lattice in both tunnel insulator and adjacent polarizer material includes initially forming cobalt-and-iron-containing material of the polarizer to be amorphous and upon which tunnel insulator material (e.g., MgO) is deposited. During and/or after the depositing, the cobalt-and-iron-containing material and the tunnel insulator may each achieve a uniform bcc (001) lattice structure.

DETAILED DESCRIPTION OF THE ILLUSTRATED EMBODIMENTS

Magnetic tunnel junctions may be utilized in spin-torque-transfer magnetic random access memory (STT-MRAM). In such applications, it can be desired that a magnetic tunnel junction have a high energy barrier so that individual memory states of the magnetic tunnel junction are persistent, and yet also have a low switching current so that power consumption is kept low. Some embodiments described herein pertain to improved magnetic tunnel junctions having configurations suitable for achieving high energy barriers and low switching currents. In particular embodiments, the magnetic recording material (i.e., free magnetic material) comprises an iridium-containing region between a pair of magnetic materials. The iridium may enable magnetic coupling of the paired magnetic materials to one another, and may also enable perpendicular magnetic anisotropy along interfaces of the iridium with the adjacent magnetic materials. The magnetic coupling of the paired magnetic materials may be antiferromagnetic or ferromagnetic, depending on the thickness of the iridium-containing region. In some embodiments, the paired magnetic materials comprise cobalt, and the iridium-containing region enables antiferromagnetic coupling of the paired magnetic materials, as well as an anisotropy field $H_k$ within the range of from about 2 kilo-Oersteds (kOe) to about 4 KOe along interfaces with the cobalt-containing materials.

Example embodiments are described with reference to FIGS. 1-3.

Figure 1:
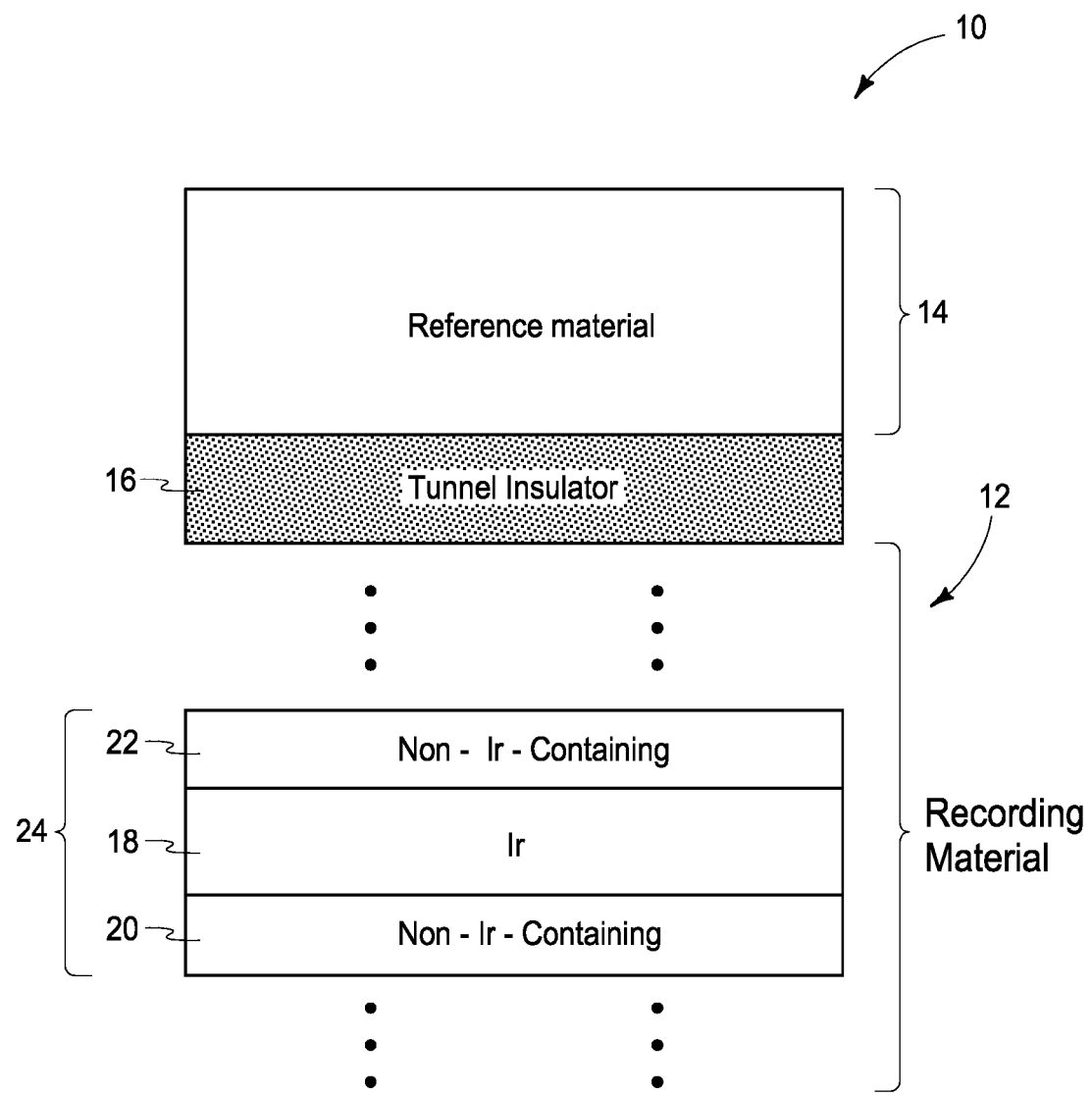
FIGS. 1-3 are diagrammatic, cross-sectional views of example embodiment magnetic tunnel junctions.

Referring to FIG. 1, a magnetic tunnel junction 10 comprises an electrically conductive first magnetic (i.e., ferrimagnetic or ferromagnetic) electrode 12 comprising magnetic recording material. An electrically conductive second magnetic electrode 14 is spaced from the first electrode 12 and comprises magnetic reference material. Accordingly, the first electrode 12 may function as a recording (i.e., free) electrode, and the second electrode 14 may function as a reference (i.e., pinned) electrode.

A nonmagnetic tunnel insulator material 16 is between the first and second electrodes 12 and 14.

Unless otherwise indicated, any of the materials and/or structures described herein may be homogeneous or nonhomogeneous, and regardless may be continuous or discontinuous over any material which such overlie. Further, unless otherwise stated, each material may be formed using any suitable existing or yet-to-be-developed technique, with atomic layer deposition, chemical vapor deposition, physical vapor deposition, epitaxial growth, diffusion doping, and ion implanting being examples. The magnetic recording material and the magnetic reference material are individually overall and collectively magnetic, even though one or both may have one or more regions therein which are intrinsically nonmagnetic.

The magnetic tunnel junction 10 may be supported by a semiconductor base (not shown). Such base may, for example, comprise semiconductor material, and in some embodiments may comprise, consist essentially of, or consist of monocrystalline silicon. In some embodiments, the semiconductor base may be considered to be a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some embodiments, the semiconductor substrate may contain one or more materials associated with integrated circuit fabrication. Some of the materials may correspond to, for example, one or more of refractory metal materials, barrier materials, diffusion materials, insulator materials, etc.

The positions of first electrode 12 and second electrode 14 may be reversed. Further, although magnetic tunnel junction 10 is shown as being generally vertically or elevationally oriented in FIG. 1, other orientations may be used. Such other orientations may include, for example, horizontal, diagonal, one or more combinations of horizontal, vertical, diagonal, etc. In this document, "horizontal" refers to a general direction along a primary surface relative to which the substrate is processed during fabrication, and "vertical" is a direction generally orthogonal thereto. Further, "vertical" and "horizontal" as used herein are generally perpendicular directions relative one another independent of orientation of the substrate in three-dimensional space. Further in this document, "elevational", "upper", "lower", "top", and "bottom" are with reference to the vertical direction. Regardless, example thicknesses for first electrode 12, tunnel insulator material 16, and second electrode 14 are about 5 to 200 Angstroms, about 5 to 50 Angstroms, and about 20 to 300 Angstroms, respectively. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses. If of variable thickness, thickness refers to average thickness unless otherwise indicated.

Any suitable composition or combination of compositions may be used for tunnel insulator material 16 and second electrode 14. Tunnel insulator material 16 may, for example, comprise, consist essentially of, or consist of one or more of $MgO$, $TiO_x$, and $AlO_x$; where "x" is a number. Magnetic reference material of second electrode 14 may, for example, comprise, consist essentially of, or consist of one or both of cobalt and iron; and may further comprise additional metals/materials (e.g., boron).

The recording material of first electrode 12 comprises an iridium-containing region 18 between a pair of non-iridium-containing regions 20 and 22.

The iridium-containing region 18 may comprise, consist essentially of, or consist of iridium. In some embodiments, the iridium-containing region 18 consists of only pure iridium. In other embodiments, the iridium-containing region 18 may comprise one or more dopants and/or other materials in combination with the iridium. Such dopants and/or other materials may be used to tailor chemical and/or physical properties of the iridium-containing region for particular applications.

The non-iridium-containing regions 20 and 22 may be magnetic, and may comprise any suitable compositions. In some embodiments, regions 20 and 22 comprise, consist essentially of, or consist of elemental cobalt or a cobalt-rich alloy. The term "cobalt-rich alloy" means an alloy in which cobalt is the greatest quantity element of all elements considered in total on an atomic/molar basis. Example cobalt-rich alloys include CoFeB and CoM (where M may be, for example, one or more of Ta, Ti, W, Mg, Ru, etc.).

In some embodiments, the non-iridium-containing regions 20 and 22 may be identical to one another in composition and/or thickness. In some embodiments, the non-iridium-containing regions 20 and 22 may differ relative to one another in one or both of composition and thickness.

The regions 20, 18 and 22 may be together considered to form a multi-material set 24 containing an iridium-containing region sandwiched between a pair of non-iridium-containing regions. In some embodiments, the recording material may comprise only one of such sets, and in other embodiments the recording material may comprise multiple of such sets. If the recording material comprises multiple sets 24, the iridium-containing regions within all of the sets may be identical to one another in composition and/or thickness in some embodiments; and in other embodiments the iridium-containing region within one of the sets may vary relative to an iridium-containing region within another of the sets in one or both of composition and thickness. Also, the non-iridium-containing regions may be identical to one another across the various sets; and in other embodiments at least one of the non-iridium-containing regions of one set may vary relative to a non-iridium-containing region of another set in one or both of composition and thickness.

The set 24 is shown spaced from the tunnel insulator 16 to indicate that there may be additional materials between the set and the tunnel insulator in some embodiments (for instance, an embodiment discussed below with reference to FIG. 2). In other embodiments, (for instance, an embodiment discussed below with reference to FIG. 3) the set 24 may be directly against the tunnel insulator 16.

The recording material is shown to extend beneath the set 24 to indicate that there may be other structures within the recording material besides the illustrated set 24. Such other structures may include, for example, other sets analogous to set 24, seed material utilized for inducing a desired crystalline lattice into a composition of the recording material, etc.

The iridium-containing region 18 may have any suitable thickness, and in some embodiments may have a thickness within a range of from about 2 angstroms (Å) to about 20 Å such as, for example, a range of from about 4 Å to about 8 Å.

The non-iridium-containing regions 20 and 22 may have any suitable thicknesses, and in some embodiments may have thicknesses within a range of from about 2 Å to about 15 Å.

The multi-material set 24 may act as a magnetic entity; with region 20 magnetically coupled to region 22 through iridium-containing region 18. The magnetic coupling may be ferromagnetic or antiferromagnetic; and in some embodiments it may be preferred that the magnetic coupling be antiferromagnetic.

Figure 2:
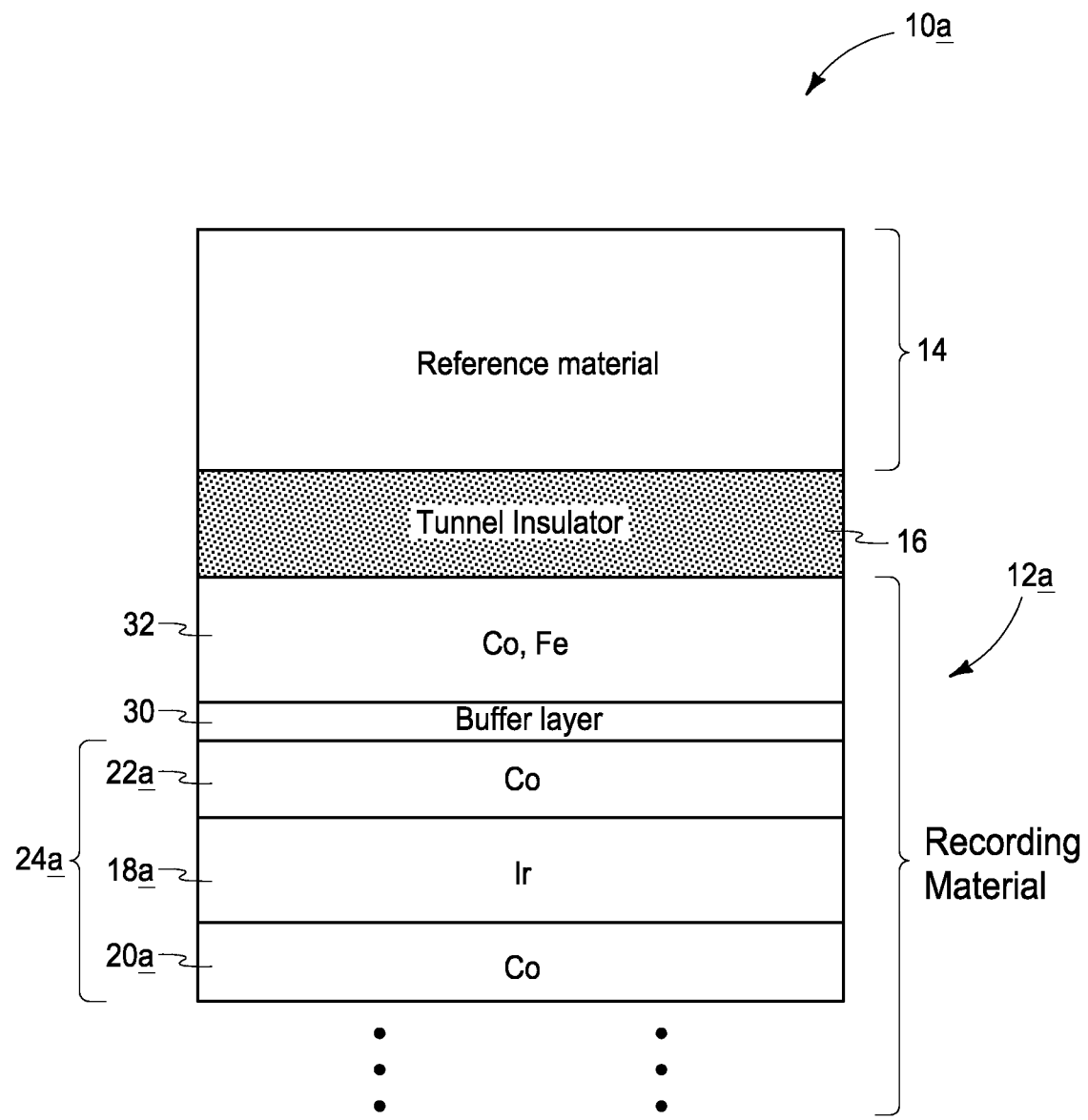
Figure 3:
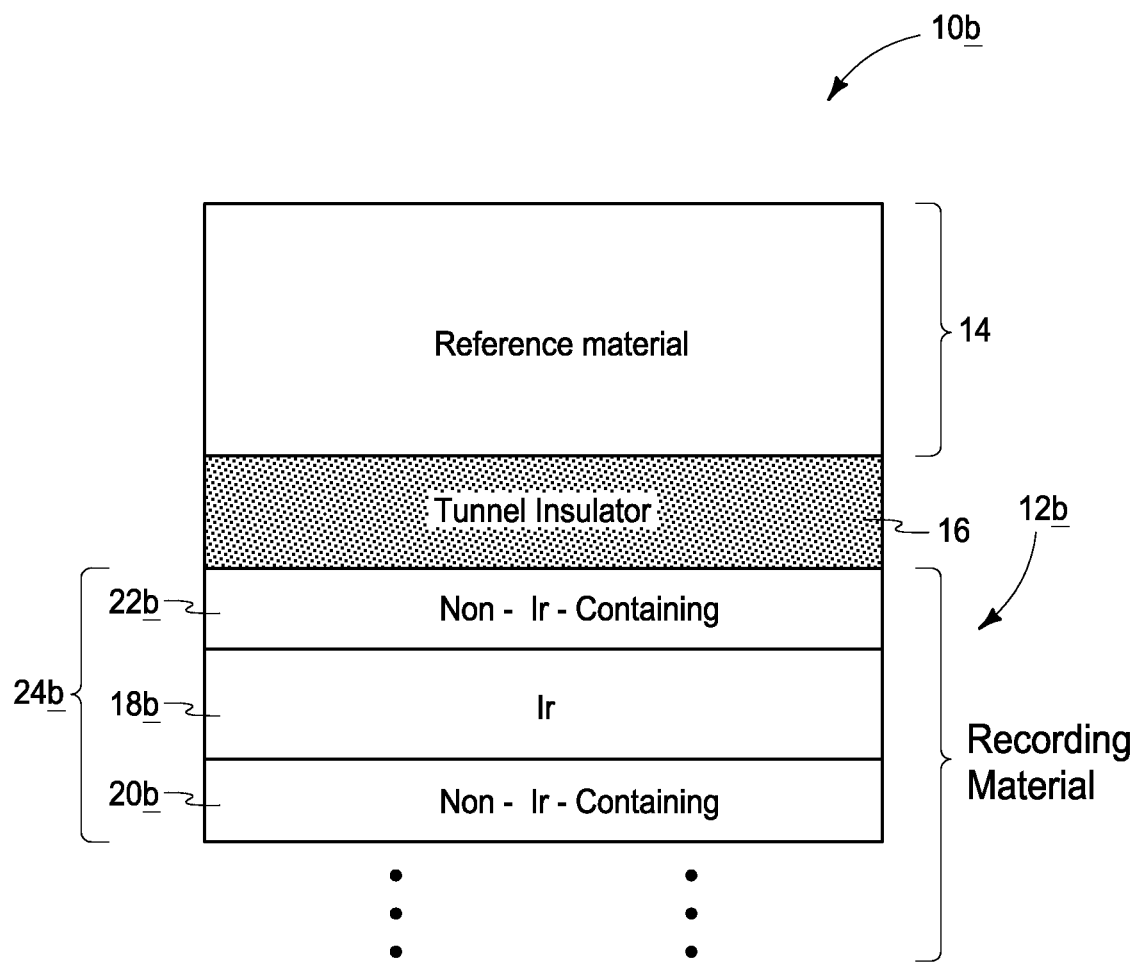

FIG. 2 shows another embodiment magnetic tunnel junction 10a. The magnetic tunnel junction 10a includes a second electrode 14 comprising reference material and includes a tunnel insulator 16, analogous to the second electrode and tunnel insulator discussed above with reference to FIG. 1.

The magnetic tunnel junction 10a comprises a multi-material set 24a containing an iridium-containing region 18a sandwiched between a pair of cobalt-containing regions 20a and 22a. The regions 18a, 20a and 22a are analogous to the regions 18, 20 and 22 discussed above with reference to FIG. 1.

The multi-material set 24a may preferably have a first crystalline lattice corresponding to face centered cubic fcc (111).

The tunnel insulator 16 may preferably have a second crystalline lattice corresponding to body centered cubic bcc (001).

In the illustrated embodiment, a buffer region 30 and a magnetic region 32 are provided between the first crystalline lattice of set 24a and the second crystalline lattice of tunnel insulator 16.

The buffer region 30 may comprise substantially amorphous material; and may, for example, comprise, consist essentially of, or consist of one or more of tantalum, ruthenium, tungsten, molybdenum, etc. The buffer region may have a thickness of, for example, from about 1 Å to about 5 Å. In some embodiments, the buffer region may be omitted, and a bcc lattice may be formed directly against an fcc lattice.

The magnetic region 32 may comprise material having a bcc (001) lattice, and in some embodiments may be utilized to induce a desired lattice within the material of tunnel insulator 16. Magnetic region 32 may comprise any suitable composition, and in some embodiments may comprise cobalt and iron. In particular embodiments, the magnetic region 32 may comprise, consist essentially of, or consist of cobalt and iron; either alone, or in combination with one or both of boron and carbon. In some embodiments, the region 32 may be considered to be an uppermost region of the recording material of electrode 12a; and in the shown embodiment is directly adjacent to the nonmagnetic material of tunnel insulator 16.

The embodiments of FIGS. 1 and 2 show the multi-material sets 24 and 24a spaced from tunnel insulator 16 by one or more intervening materials. However, in some embodiments an analogous multi-material set may be provided directly against the tunnel insulator. For instance, FIG. 3 shows a magnetic tunnel junction 10b comprising a multi-material set 24b directly adjacent the tunnel insulator 16.

The set 24b comprises iridium-containing material 18b, non-iridium-containing material 20b, and non-iridium-containing material 22b analogous to the materials 18, 20 and 22 described above with reference to FIG. 1. The material 22b may be a magnetic material of the type described as material 32 in FIG. 2.

The set 24b may have a different crystallographic lattice than tunnel insulator 16. For instance, the set 24b may have an fcc (111) lattice while the insulator 16 has a bcc (001) lattice. Although there is lattice mismatch at an interface of the material 22b and the insulator 16, such may not be problematic in some applications. If the lattice mismatch proves to be problematic, then the embodiment of FIG. 2 may be utilized instead of that of FIG. 3.

The magnetic tunnel junctions discussed above may be utilized in memory products or specific memory technologies (e.g., NAND, DRAM, PCM, NOR, etc.), or in other technologies (e.g., logic, sensors, oscillators, etc.). The magnetic tunnel junctions may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a magnetic tunnel junction which has a conductive first magnetic electrode containing magnetic recording material, a conductive second magnetic electrode spaced from the first electrode and containing magnetic reference material, and a non-magnetic insulator material between the first and second electrodes. The magnetic recording material of the first electrode includes a set having an iridium-containing region between a pair of non-iridium-containing regions.

Some embodiments include a magnetic tunnel junction which has a conductive first magnetic electrode containing magnetic recording material, a conductive second magnetic electrode spaced from the first electrode and containing magnetic reference material, and a non-magnetic insulator material between the first and second electrodes. The magnetic recording material of the first electrode comprises a multi-material set containing an iridium-containing region sandwiched between a pair of non-iridium-containing regions. The multi-material set has a first crystalline lattice, and the non-magnetic insulator material has a second crystalline lattice which is different from the first crystalline lattice. A buffer region is between the multi-material set and the magnetic insulator material.

Some embodiments include a magnetic tunnel junction which has a conductive first magnetic electrode containing magnetic recording material, a conductive second magnetic electrode spaced from the first electrode and containing magnetic reference material, and a non-magnetic insulator material between the first and second electrodes. The magnetic recording material of the first electrode comprises a set having an iridium-containing region between a pair of cobalt-containing regions. The iridium-containing region has a thickness within a range of from about 2 Å to about 20 Å.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A magnetic tunnel junction, comprising:
a conductive first magnetic electrode comprising magnetic recording material;
a conductive second magnetic electrode spaced from the first electrode and comprising magnetic reference material;
a non-magnetic insulator material between the first and second electrodes;
the magnetic recording material of the first electrode comprising a set having an iridium-containing region between a pair of non-iridium-containing regions;
wherein the magnetic recording material of the first electrode comprises an uppermost region containing Co and Fe, with said uppermost region being directly adjacent to the non-magnetic insulator material; and
wherein said set does not include the uppermost region as one of the non-iridium-containing regions of said pair; wherein said set includes a first crystalline lattice; wherein said uppermost region comprises a second crystalline lattice different from said first crystalline lattice; and wherein the uppermost region is spaced from the set by a buffer material.

2. The magnetic tunnel junction of claim 1 wherein the buffer material comprises one or more of tantalum, ruthenium, tungsten, molybdenum.

3. A magnetic tunnel junction, comprising:
a conductive first magnetic electrode comprising magnetic recording material;
a conductive second magnetic electrode spaced from the first electrode and comprising magnetic reference material;
a non-magnetic insulator material between the first and second electrodes;
the magnetic recording material of the first electrode comprising a set having an iridium-containing region between a pair of non-iridium-containing regions;
wherein said set is one of two or more sets comprising an iridium-containing region between a pair of non-iridium-containing regions; and
wherein at least one of the iridium-containing regions of said two or more sets is different in one or both of composition and thickness relative to at least one other of the iridium-containing regions of said two or more sets.

4. A magnetic tunnel junction, comprising:
a conductive first magnetic electrode comprising magnetic recording material;
a conductive second magnetic electrode spaced from the first electrode and comprising magnetic reference material;
a non-magnetic insulator material between the first and second electrodes;
the magnetic recording material of the first electrode comprising a set having an iridium-containing region between a pair of non-iridium-containing regions;
wherein said set is one of two or more sets comprising an iridium-containing region between a pair of non-iridium-containing regions; and
wherein at least one of the non-iridium-containing regions of said two or more sets is different in one or both of composition and thickness relative to at least one other of the non-iridium-containing regions of said two or more sets.

5. The magnetic tunnel junction of claim 4 wherein the magnetic recording material of the first electrode comprises an uppermost region containing Co and Fe, with said uppermost region being directly adjacent to the non-magnetic insulator material; and wherein said one of the two or more sets includes the uppermost region as one of the non-iridium-containing regions of said pair.

6. A magnetic tunnel junction, comprising:
a conductive first magnetic electrode comprising magnetic recording material;
a conductive second magnetic electrode spaced from the first electrode and comprising magnetic reference material;
a non-magnetic insulator material between the first and second electrodes;
the magnetic recording material of the first electrode comprising a multi-material set containing an iridium-containing region sandwiched between a pair of non-iridium-containing regions;
wherein the multi-material set has a first crystalline lattice, and the non-magnetic insulator material has a second crystalline lattice which is different from the first crystalline lattice; and
wherein a buffer region is between the multi-material set and the magnetic insulator material.

7. The magnetic tunnel junction of claim 6 wherein the first crystalline lattice is face centered cubic fcc (111); and wherein the second crystalline lattice is body centered cubic bcc (001).

8. The magnetic tunnel junction of claim 6 wherein the buffer region consists of one or more of tantalum, ruthenium, tungsten, molybdenum.

9. The magnetic tunnel junction of claim 8 wherein the conductive first magnetic electrode further comprises an uppermost region containing Co and Fe, with said uppermost region being directly adjacent to the non-magnetic insulator material, and being spaced from said multi-material set by the buffer region; and wherein the uppermost region comprises the second crystalline lattice.

10. A magnetic tunnel junction, comprising:
a conductive first magnetic electrode comprising magnetic recording material;
a conductive second magnetic electrode spaced from the first electrode and comprising magnetic reference material;
a non-magnetic insulator material between the first and second electrodes; and
the magnetic recording material of the first electrode comprising a set having an iridium-containing region between a pair of cobalt-containing regions; the iridium-containing region having a thickness within a range of from about 2 Å to about 20 Å; and
wherein said set is one of a plurality of sets comprised by the recording material and having an iridium-containing region between a pair of cobalt-containing regions, with the iridium-containing region having the thickness within the range of from about 2 Å to about 20 Å, and wherein at least one of the sets of said plurality of sets comprises at least one cobalt-containing region having a different composition and/or thickness relative to at least one other of the sets of said plurality of sets.

\* \* \* \* \*